(12) United States Patent
Myung

(10) Patent No.: US 11,716,879 B2
(45) Date of Patent: Aug. 1, 2023

(54) DISPLAY DEVICE WITH DUMMY PORTIONS ON NON-DISPLAY AREA

(71) Applicant: LG Display Co., Ltd., Seoul (KR)

(72) Inventor: Jaehwan Myung, Paju-si (KR)

(73) Assignee: LG DISPLAY CO., LTD.

( * ) Notice: Subject to any disclaimer, the term of this patent is extended or adjusted under 35 U.S.C. 154(b) by 107 days.

(21) Appl. No.: 17/138,102

(22) Filed: Dec. 30, 2020

(65) Prior Publication Data
US 2021/0202629 A1    Jul. 1, 2021

(30) Foreign Application Priority Data

Dec. 31, 2019    (KR) .................... 10-2019-0179718

(51) Int. Cl.
| | | |
|---|---|---|
| H01L 27/32 | (2006.01) | |
| H01L 51/00 | (2006.01) | |
| H10K 59/122 | (2023.01) | |
| H10K 71/10 | (2023.01) | |
| G09G 3/3233 | (2016.01) | |
| G09G 3/3266 | (2016.01) | |
| G09G 3/3275 | (2016.01) | |

(52) U.S. Cl.
CPC ......... *H10K 59/122* (2023.02); *H10K 71/191* (2023.02); *G09G 3/3233* (2013.01); *G09G 3/3266* (2013.01); *G09G 3/3275* (2013.01); *G09G 2310/08* (2013.01)

(58) Field of Classification Search
CPC ............ H01L 27/3246; H01L 51/0012; G09G 3/3233; G09G 3/3266; G09G 3/3275; G09G 2310/08
See application file for complete search history.

(56) References Cited

U.S. PATENT DOCUMENTS

| | | | |
|---|---|---|---|
| 2004/0140759 A1* | 7/2004 | Park ..................... | H01L 27/3283 313/504 |
| 2005/0264177 A1* | 12/2005 | Chung ................. | H10K 59/122 313/506 |
| 2007/0228936 A1* | 10/2007 | Kim ..................... | H10K 59/173 313/503 |
| 2015/0333110 A1* | 11/2015 | Park .................... | H01L 27/3248 438/23 |
| 2016/0181335 A1* | 6/2016 | Mori .................... | H10K 71/191 257/40 |

\* cited by examiner

*Primary Examiner* — Peter Bradford
(74) *Attorney, Agent, or Firm* — Polsinelli PC

(57) ABSTRACT

A display device includes a substrate including a display area in which pixels are arranged, and a non-display area in which dummy patterns are arranged, the non-display area surrounding the display area; an emission layer formed in the pixels and the dummy patterns; and a bank surrounding the emission layer, wherein in the non-display area, the bank includes multiple protrusions protruding from a side of the bank into the dummy pattern.

20 Claims, 14 Drawing Sheets

DISPLAY DEVICE WITH DUMMY PORTIONS ON NON-DISPLAY AREA

CROSS-REFERENCE TO RELATED APPLICATION

The present application claims priority to Korean Patent Application No. 10-2019-0179718, filed Dec. 31, 2019, which is hereby incorporated by reference in its entirety.

BACKGROUND

Field of the Disclosure

The present disclosure relates to a display device.

Description of the Background

As information society has developed, various types of display devices have been developed. In recent years, various display devices, such as a liquid crystal display (LCD), a plasma display panel (PDP), and an organic light-emitting diode (OLED) display, have been used.

Organic light-emitting elements constituting an organic light-emitting diode display are self-luminous and do not require a separate light source, so that the thickness and weight of the display device are reduced. In addition, the organic light-emitting diode display has high quality characteristics, such as low power consumption, high luminance, and a high response rate.

Recently, a technology for forming an emission layer of an organic light-emitting element through a solution process with use of inkjet equipment, and the like has been developed. The solution process is performed by applying a solution for forming an emission layer in a set area and then drying the solution. Herein, due to dewetting of the solution occurring at the outer portion, the emission layer may not properly formed in the pixels formed at the outer portion, which may result in pixel defects.

The foregoing is intended merely to aid in the understanding of the background of the present disclosure, and is not intended to mean that the present disclosure falls within the purview of the related art that is already known to those skilled in the art.

SUMMARY

Accordingly, the present disclosure provides a display device configured in such a manner that pixels formed through a solution process uniformly emit light.

In addition, the present disclosure is to provide a display device in which an outer portion of an area to which a solution is applied is set as a dummy area and dewetting in the dummy area is prevented, thereby enhancing uniformity in emission of light from pixels.

According to an aspect of the present disclosure, there is provided a display device including: a substrate including a display area in which pixels are arranged, and a non-display area in which dummy patterns are arranged, the non-display area surrounding the display area; an emission layer formed in the pixels and the dummy patterns; and a bank surrounding the emission layer, wherein in the non-display area, the bank includes multiple protrusions protruding from a side of the bank into the dummy pattern.

Each of the protrusions may include: a first inclined side; and a second inclined side disposed farther from the display area than the first inclined side. The first inclined side may extend from the side of the bank to form an obtuse angle to the side of the bank, and the second inclined side may extend from the side of the bank to form an acute angle or a right angle to the side of the bank.

The bank may include: a first bank with hydrophilicity; and a second bank formed on the first bank, and provided with at least one area with hydrophobicity.

Each of the protrusions may include: an extended part extending from the first bank; and an extended part extending from the second bank.

Each of the protrusions may include a third bank with hydrophilicity, and a thickness of the third bank is formed larger than a thickness of the first bank.

Each of the protrusions may further include the second bank formed on the third bank.

The third bank may be formed to cover at least a part of an upper surface of the first bank on which the second bank is not formed, and to contact with a side of the second bank.

A thickness of the bank in the display area is formed larger than a thickness of the bank in the non-display area.

A thickness of the first bank in the non-display area is formed to be equal to or larger than a thickness of the first bank in the display area.

In the display area, the first bank may be disposed between pixel columns of the display area and between pixel rows of the display area, and in the display area, the second bank may be disposed on the first bank between the pixel columns.

Each of the dummy patterns may have a shape of a bar extending from an adjacent pixel row or an adjacent pixel column.

For each pixel column, the emission layer may be formed integrally in the pixel column and the dummy pattern adjacent to the pixel column.

A thickness of the emission layer in a central region is smaller than a thickness of the emission layer in an edge region adjacent to the bank.

The display device may further include: an anode electrode disposed under the emission layer for each of the pixels in the display area; and a cathode electrode formed on the emission layer and the bank.

According to of the present disclosure, the display device may enhance the uniformity in emission of light from the pixels formed in the same pixel column.

BRIEF DESCRIPTION OF THE DRAWINGS

The above and other features and other advantages of the present disclosure will be more clearly understood from the following detailed description when taken in conjunction with the accompanying drawings, in which.

DETAILED DESCRIPTION OF THE DISCLOSURE

Figure 1:
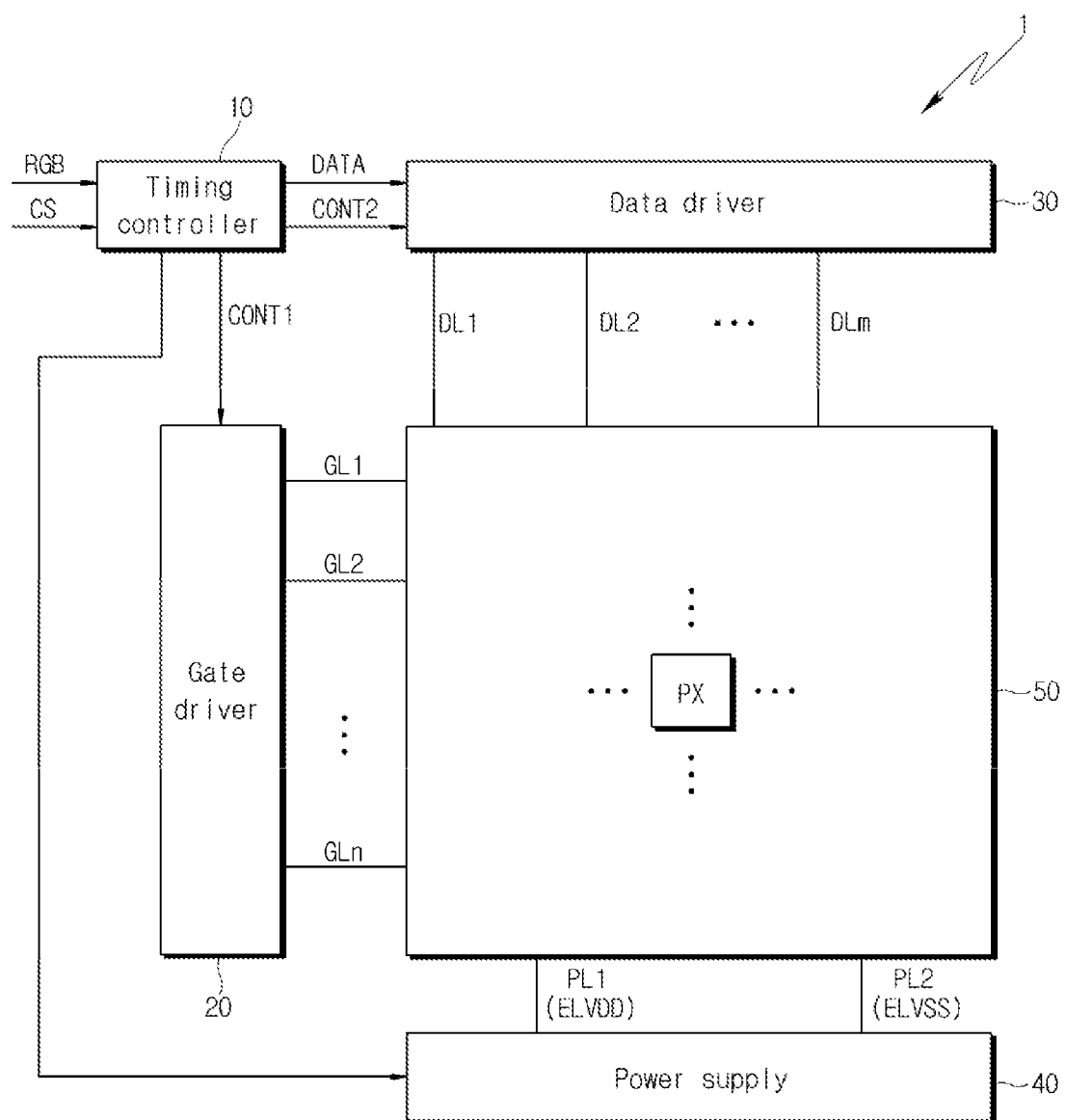
FIG. 1 is a block diagram showing a configuration of a display device according to an aspect of the present disclosure.

Hereinafter, aspects of the present disclosure will be described with reference to the accompanying drawings. In the specification, when an element (area, layer, part, or the like) is referred to as being "on", "coupled to", or "combined with" another element, it may be directly on/coupled to/combined with the other element or an intervening element may be present therebetween.

The same reference numerals refer to same elements. In the drawings, the thicknesses, ratios, and sizes of the elements are exaggerated for effective description of the technical details. The term "and/or" includes one or more combinations that the associated elements may define.

Terms "first", "second", etc. can be used to describe various elements, but the elements are not to be construed as being limited to the terms. The terms are only used to differentiate one element from other elements. For example, the "first" element may be named the "second" element without departing from the scope of the aspects, and the "second" element may also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof may exist or may be added.

FIG. 1 is a block diagram showing a configuration of a display device according to an aspect.

Referring to FIG. 1, a display device 1 includes a timing controller 10, a gate driver 20, a data driver 30, a power supply 40, and a display panel 50.

The timing controller 10 may receive an image signal RGB and a control signal CS from outside. The image signal RGB may include grayscale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may be connected to pixels PXs of the display panel 50 through multiple gate lines GL1 to GLn. The gate driver 20 may generate gate signals on the basis of the gate driving control signal CONT1 output from the timing controller 10. The gate driver 20 may provide the generated gate signals to the pixels PXs through the multiple gate lines GL1 to GLn.

The data driver 30 may be connected to the pixels PXs of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PXs through the multiple data lines DL1 to DLm.

In various aspects, the data driver 30 may be further connected to the pixels PXs of the display panel 50 through multiple sensing lines (or reference lines). The data driver 30 may provide a reference voltage (a sensing voltage, or an initialization voltage) to the pixels PXs through the multiple sensing lines, or may sense states of the pixels PXs on the basis of an electrical signal fed back from the pixels PXs.

The power supply 40 may be connected to the pixels PXs of the display panel 50 through multiple power lines PL1 and PL2. The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PXs, through the corresponding power lines PL1 and PL2.

In the display panel 50, the multiple pixels PXs (or referred to as subpixels) are arranged. The pixels PXs may be, for example, arranged in a matrix form on the display panel 50.

Each of the pixels PXs may be electrically connected to the corresponding gate line and the corresponding data line. Such pixels PXs may emit light with luminance corresponding to the gate signals and the data signals that are supplied through the gate lines GL1 to GLn and the data lines DL1 to DLm, respectively.

Each pixel PX may display any one among a first to a third color. In an aspect, each pixel PX may display any one among red, green, and blue colors. In another aspect, each pixel PX may display any one among cyan, magenta, and yellow colors. In various aspects, the pixels PXs may be configured to display any one among four or more colors. For example, each pixel PX may display any one among red, green, blue, and white colors.

The timing controller 10, the gate driver 20, the data driver 30, and the power supply 40 may be configured as separate integrated circuits (ICs), or ICs in which at least some thereof are integrated. For example, at least one of the data driver 30 and the power supply 40 may be configured as an integrated circuit integrated with the timing controller 10.

In addition, in FIG. 1, the gate driver 20 and the data driver 30 are shown as elements separate from the display panel 50, but at least one of the gate driver 20 and the data driver 30 may be configured in an in-panel manner that is formed integrally with the display panel 50. For example, the gate driver 20 may be formed integrally with the display panel 50 according to a gate-in-panel (GIP) manner.

Figure 2:
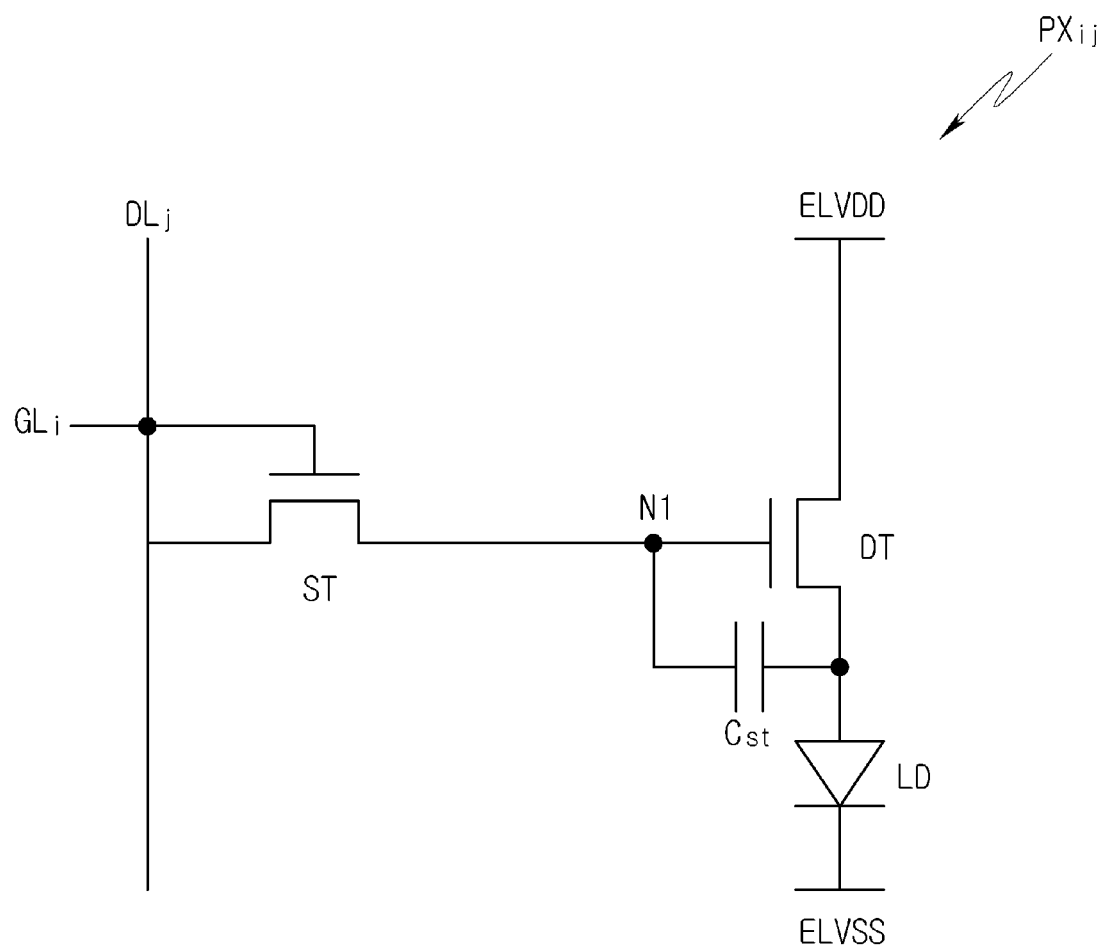
FIG. 2 is a circuit diagram showing a pixel shown in FIG. 1.

FIG. 2 is a circuit diagram showing an aspect of the pixel shown in FIG. 1. FIG. 2 shows, as an example, a pixel PXij that is connected to an i-th gate line GLi and a j-th data line DLj.

Referring to FIG. 2, the pixel PXij includes a switching transistor ST, a driving transistor DT, a storage capacitor Cst, and a light-emitting element LD.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th gate line GLi. The switching transistor ST is turned on when a gate signal at a gate-on level is applied to through the i-th gate line GLi, and transmits a data signal applied through the j-th data line DLj, to the first node N1.

A first electrode of the storage capacitor Cst is electrically connected to the first node N1, and a second electrode of the storage capacitor Cst receives a high-potential driving voltage ELVDD. The storage capacitor Cst may be charged with a voltage corresponding to the difference between a voltage applied to the first node N1 and the high-potential driving voltage ELVDD.

A first electrode (for example, a source electrode) of the driving transistor DT receives the high-potential driving voltage ELVDD, and a second electrode (for example, a drain electrode) of the driving transistor DT is electrically connected to a first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage applied to the gate electrode.

The light-emitting element LD outputs light corresponding to the driving current. The light-emitting element LD may output light corresponding to any one among red, green, blue, and white colors. The light-emitting element LD may be an organic light-emitting diode (OLED) or an ultra-small inorganic light-emitting diode having a size in a micro to nanoscale range, but this aspect is not limited thereto. Hereinafter, the technical idea of this aspect will be described with reference to an aspect in which the light-emitting element LD is an organic light-emitting diode.

In this aspect, the structure of the pixels PXijs is not limited to that shown in FIG. 2. According to an aspect, the pixels PXijs may further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST and the driving transistor DT are NMOS transistors, but this aspect is not limited thereto. For example, at least some or all of the transistors constituting each pixel PXij may be configured as a PMOS transistor. In various aspects, each of the switching transistor ST and the driving transistor DT may be implemented as a low-temperature polycrystalline silicon (LTPS) thin-film transistor, an oxide thin-film transistor, or a low-temperature polycrystalline oxide (LTPO) thin-film transistor.

Figure 3:
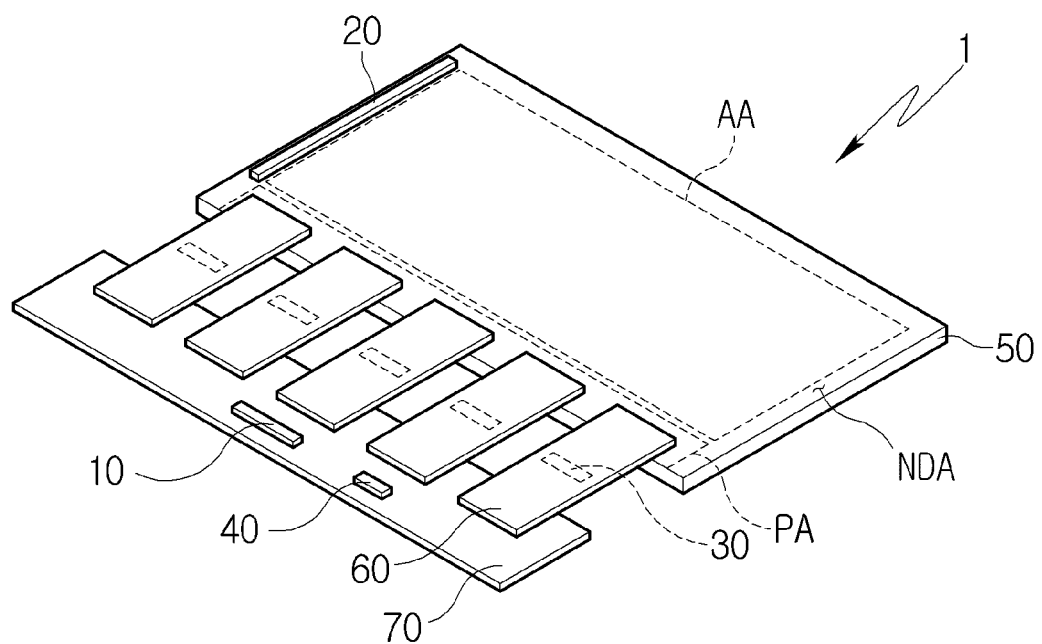
FIG. 3 is a schematic perspective view of a display panel shown in FIG. 1.

FIG. 3 is a schematic perspective view of the display panel shown in FIG. 1.

With reference to FIG. 3 in connection with FIGS. 1 and 2, the elements of the display device 1 will be described in more detail.

The display device 1 may be implemented in various shapes. For example, the display device 1 may be implemented in the shape of a rectangular plate. However, this aspect is not limited thereto. The display device 1 may be provided in various shapes, such as square, circular, elliptical, polygonal shapes, and the like. The display device 1 may have a shape in which a part of the edge processed to be a curved surface or the thicknesses in at least one area vary. In addition, all or a part of the display device 1 may have flexibility.

The display panel 50 may include a display area AA and a non-display area NDA. The display area AA is an area in which the pixels PXs are arranged, and may be referred to as an active area. The non-display area NDA may be disposed adjacent to the display area AA. For example, the non-display area NDA may be disposed along the border of the display area AA. The non-display area NDA may comprehensively refer to an area except the display area AA on the display panel 50, and may be referred to as a non-active area.

In the non-display area NDA, as a driver for driving the pixels PXs, for example, the gate driver 20 may be provided. In the non-display area NDA, the gate driver 20 may be disposed adjacent to one side or both sides of the display area AA. The gate driver 20 may be formed in the non-display area NDA of the display panel 50 in a gate-in-panel manner as shown in FIG. 3. However, in another aspect, the gate driver 20 may be manufactured as a driver IC and may thus be mounted on a flexible film, or the like, and may be attached to the non-display area NDA in a tape-automated bonding (TAB) manner.

In the non-display area NDA, multiple pads (not shown) may be provided. The pads may not be covered by an insulation layer, but may be exposed to the outside of the display panel 50 and may be electrically connected to the data driver 30, a circuit board 70, and the like that will be described later.

The display panel 50 may include wires for supplying electrical signals to the pixels PXs. The wires may include, for example, the gate lines GL1 to GLn, the data lines DL1 to DLm, and the power lines PL1 and PL2.

The power lines PL1 and PL2 may be electrically connected to the power supply 40 (or the timing controller 10) through the connected pads, and may provide the high-potential driving voltage ELVDD and the low-potential driving voltage ELVSS provided from the power supply 40 (or the timing controller 10), to the pixels PXs.

A flexible film 60 is provided with a first end attached to a pad area PA of the display panel 50, and is provided with a second end attached to the circuit board 70, so that the display panel 50 and the circuit board 70 may be electrically connected. The flexible film 60 may include multiple wires for electrically connecting the pads formed in the pad area PA and wires of the circuit board 70. In an aspect, the flexible film 60 may be attached on the pads through an anisotropic conducting film (ACF).

In the case where the data driver 30 is manufactured as a driver IC, the data driver 30 may be mounted on the flexible film 60 in a chip-on-film (COF) manner or a chip-on-plastic (COP) manner. The data driver 30 may generate data signals on the basis of the image data DATA and the data driving control signal CONT2 received from the timing controller 10, and may output the generated data signals to the data lines DL1 to DLm through the connected pads.

On the circuit board 70, a number of circuits implemented as driver ICs may be mounted. The circuit board 70 may be a printed circuit board or a flexible printed circuit board, but the type of the circuit board 70 is not limited thereto.

The circuit board 70 may include the timing controller 10 and the power supply 40 mounted in the form of an integrated circuit. FIG. 3 shows that the timing controller 10 and the power supply 40 are separate elements, but this aspect is not limited thereto. That is, in various aspects, the power supply 40 may be formed integrally with the timing controller 10, or the timing controller 10 may be configured to perform the function of the power supply 40.

Figure 4:
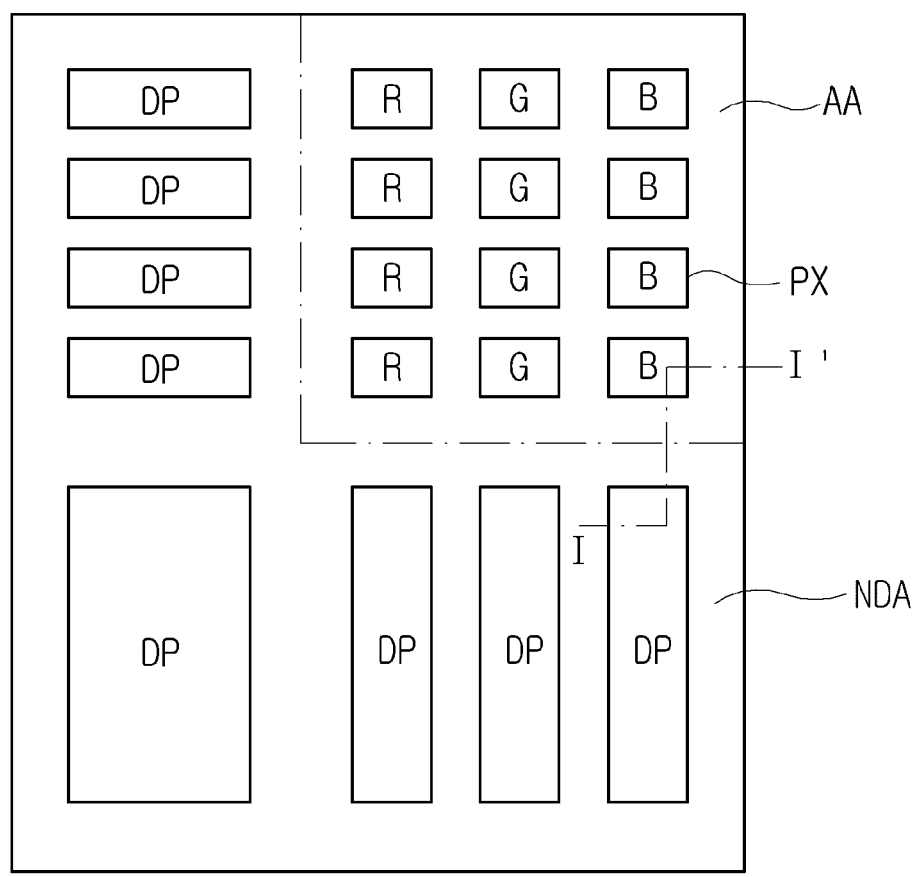
FIG. 4 is a schematic partial enlarged plan view of a display area and a non-display area according to an aspect of the present disclosure.
Figure 5:
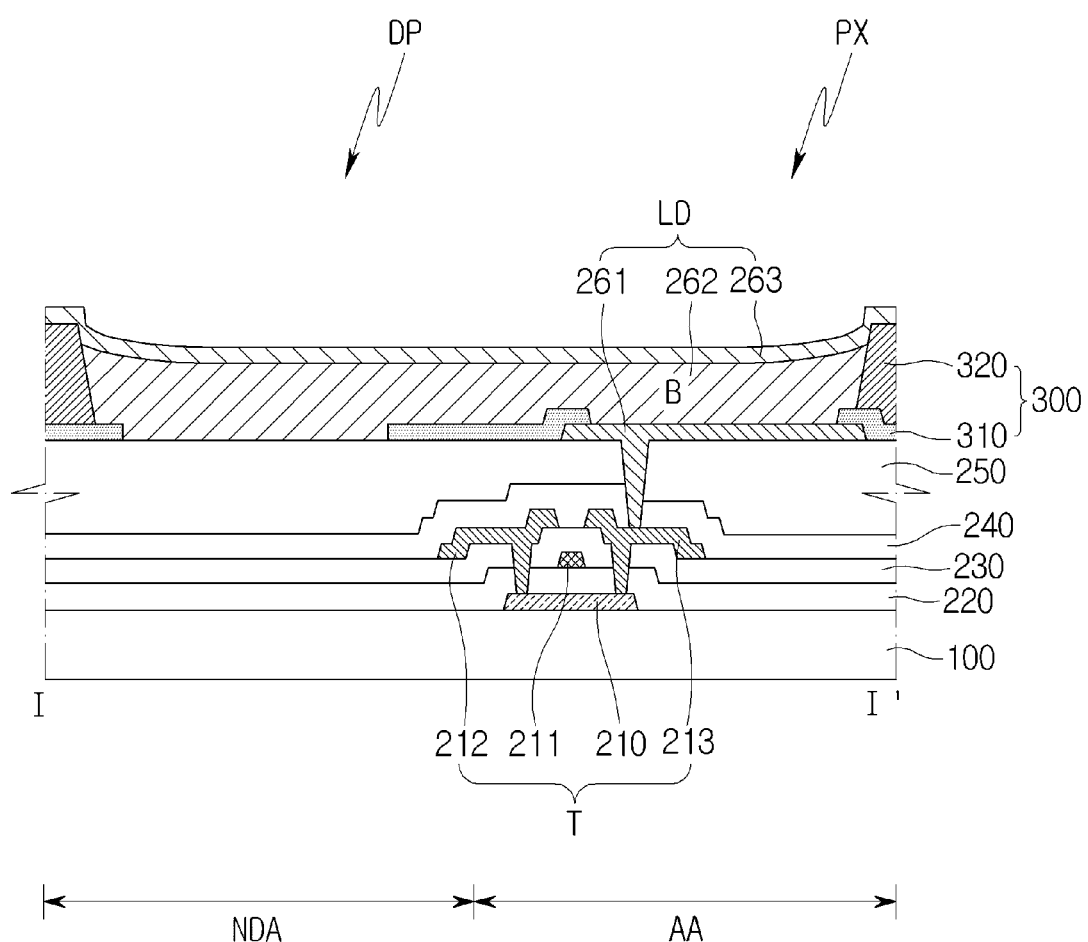
FIG. 5 is a cross-sectional view taken along line I-I' of FIG. 4.

FIG. 4 is a schematic partial enlarged plan view of a display area and a non-display area according to an aspect. FIG. 5 is a cross-sectional view taken along line I-I' of FIG. 4.

Referring to FIG. 4, the pixels PXs may be arranged in multiple pixel rows and multiple pixel columns within the display area AA and may thus be disposed in a matrix form. Herein, as shown in FIG. 4, the same pixels PXs are arranged in one pixel column. In one pixel row, as shown, R, G, and B pixels are arranged repeatedly in that order (stripe type). However, this aspect is not limited to that shown. In various aspects, in one pixel row, R, G, B, and G pixels are arranged repeatedly in that order (PenTile type).

In the non-display area NDA, dummy patterns DPs are arranged. The dummy patterns DPs may be arranged adjacent to the pixel rows and the pixel columns arranged in the display area AA.

In the shown aspect, each of the dummy patterns DPs is shown as having the shape of a bar extending from the nearby pixel row or pixel column. However, the shape of the dummy pattern DP is not limited to that shown. The dummy patterns DPs may have various shapes, such as being wider than the pixel column or pixel row, or having the multiple dummy patterns DPs connected to each other.

Hereinafter, the more detailed structure of the pixels PXs and the dummy patterns DPs will be described.

Referring to FIG. 5, the substrate 100 is a base member of the display panel 50, and may be a light-transmissive substrate. The substrate 100 may be a rigid substrate including glass or tempered glass, or may be a flexible substrate made of a plastic material.

In an aspect, a buffer layer (not shown) may be formed on the substrate 100. The buffer layer may prevent diffusion of ions or impurities from the substrate 100, and may block moisture penetration.

The substrate 100 may include the display area AA and the non-display area NDA. In the display area AA on the substrate 100, a circuit element layer and a light-emitting element layer may be formed.

The circuit element layer may include circuit elements (for example, the switching transistor ST, the driving transistor DT, the storage capacitor Cst, and the like) and signal lines constituting the pixel PXij. In the case where a buffer layer is formed, the circuit element layer may be formed on a buffer layer.

First, on the substrate 100, an active pattern 210 may be formed. The active pattern 210 may be made of a silicon-based semiconductor material or an oxide-based semiconductor material.

On the active pattern 210, a gate insulation layer 220 may be formed. On the gate insulation layer 220, a gate electrode 211 may be formed. On the gate electrode 211, an interlayer insulation layer 230 may be formed. On the interlayer insulation layer 230, a source electrode 212 and a drain electrode 213 may be formed. The source electrode 212 and the drain electrode 213 may be connected to the active pattern 210 through contact holes penetrating through the interlayer insulation layer 230 and the gate insulation layer 220.

The source electrode 212, the drain electrode 213, the gate electrode 211, and the active pattern 210 corresponding thereto may constitute the transistor T. The transistor T may be, for example, the driving transistor DT or the switching transistor ST. FIG. 5 shows, as an example, the driving transistor DT of which the drain electrode 213 is connected to a first electrode 261 of the light-emitting element LD.

On the source electrode 212 and the drain electrode 213, a passivation layer 240 may be formed. The passivation layer 240 is an insulation layer for protecting the lower elements, and may be made of an inorganic material or an organic material.

On the passivation layer 240, an overcoat layer 250 may be formed. The overcoat layer 250 may be a planarizing film for reducing the step difference in the lower structure.

In the circuit element layer, circuit elements such as various signal lines and capacitors that are not shown may be further formed. The signal lines may include, for example, a gate line GL, a data line DL, and the like described with reference to FIGS. 1 and 2.

The light-emitting element layer is formed on the overcoat layer 250, and includes light-emitting elements LDs. The light-emitting element LD includes the first electrode 261, the emission layer 262, and a second electrode 263. The first electrode 261 may be an anode electrode, and the second electrode 263 may be a cathode electrode.

The first electrode 261 is formed on the overcoat layer 250. The first electrode 261 is connected to the drain electrode 213 of the transistor T through the via hole penetrating through the overcoat layer 250 and the passivation layer 240.

On the overcoat layer 250, a bank 300 may be further formed. In the display area AA, the bank 300 is formed to cover a part of the edge of the first electrode 261.

In various aspects, the bank 300 may be composed of a first bank 310 having a hydrophilic property, and a second bank 320 having a hydrophobic property. In an aspect, the first bank 310 may be formed in such a manner as to be thinner than the second bank 320, and may be formed in such a manner as to be wider than the second bank 320. By the first bank 310 having the hydrophilic property, a solution for forming the emission layer 262 may be easily spread when forming the emission layer 262, which will be described later, through a solution process.

The second bank 320 may be formed in a pattern through a photolithography process after applying a solution that is a mixture of an organic insulation material with hydrophilicity and a hydrophobic material such as fluorine. Due to the light emitted during the photolithography process, the hydrophobic material such as fluorine may move to the top of the second bank 320, and the top of the second bank 320 may have a hydrophobic property. However, this aspect is not limited thereto. The entire portion of the second bank 320 may be formed to have a hydrophobic property.

In the above aspect, the first bank 310 may be placed to surround each of the pixels PXs, and the second bank 320 may be placed to surround each of the pixel columns.

On the first electrode 261, the emission layer 262 is formed. The emission layer 262 is formed on an exposed partial area of the first electrode 261 which is not covered by the bank 300.

In an aspect, the emission layer 262 may be formed on the exposed first electrode 261 and the exposed first bank 310 which are not covered by the second bank 320. That is, the emission layer 262 may be formed within a pixel column area defined by the second bank 320. For example, the emission layer 262 composed of an organic material capable of emitting light in a red color may be formed in a first pixel column defined by the second bank 320. The emission layer 262 composed of an organic material capable of emitting light in a green color may be formed in a second pixel column defined by the second bank 320. The emission layer 262 composed of an organic material capable of emitting light in a blue color may be formed in a third pixel column defined by the second bank 320.

The emission layer 262 may have a multi-layer thin-film structure including a light generation layer. For example, the emission layer 262 may include a hole transport layer (HTL), an organic emission layer, and an electron transport layer (ETL). In addition, the emission layer 262 may further include a hole injection layer (HIL), a hole blocking layer (HBL), an electron injection layer (EIL), and an electron blocking layer (EBL).

In this aspect, the emission layer 262 may be formed through a solution process using inkjet equipment, and the like. In particular, the emission layer 262 may be formed by a single solution process for the pixels PXs in the same color arranged in the same pixel column. In this aspect, the inkjet equipment may apply a solution to the pixels PXs arranged in the same pixel column through a single process.

When the emission layer 262 is formed by the solution process, the difference in thickness between the central area of the emission layer 262 and the edge area adjacent to the bank 300 occurs due to the tension between the solution and the bank 300. For example, the emission layer 262 may be formed in a concave shape in which the central portion is thinnest and the area being in contact with the bank 300 is thickest. However, this aspect is not limited thereto. That is, in various aspects, structures for enhancing uniformity in thickness of the emission layer 262 may be placed, and the emission layer 262 may have a wholly uniform thickness.

The second electrode 263 is formed on the emission layer 262 and the bank 300. That is, the second electrode 263 may be formed to cover the emission layer 262 and the bank 300.

Although not shown, on the second electrode 263, an encapsulation layer may be formed. The encapsulation layer prevents external moisture from penetrating into the emission layer 262. The encapsulation layer may be made of an inorganic insulation material or may be formed in a structure in which an inorganic insulation material and an organic insulation material are alternately stacked, but is not necessarily limited thereto.

In the non-display area NDA on the substrate 100, the circuit element layer, the emission layer 262, the second electrode 263, the bank 300, and the encapsulation layer may be formed.

The circuit element layer may be formed in the same structure and through the same single process as the circuit element layer formed in the display area AA. However, in the non-display area NDA, at least some or all of the signal lines and circuit elements may not be formed in the circuit element layer.

On the overcoat layer 250 of the circuit element layer, the bank 300 may be formed. In the non-display area NDA, the bank 300 may be a definition film defining the shape of the dummy pattern DP. The dummy pattern DP defined by the bank 300 may have the shape of a bar extending from the pixel row or the pixel column, as described above with reference to FIG. 3.

In the non-display area NDA, the bank 300 may be configured to be thicker than in the display area AA. For example, at least one of the first bank 310 and the second bank 320 may be thicker in the non-display area NDA than in the display area AA.

The more detailed structure of the bank 300 in the non-display area NDA will be described below with reference to the drawings.

On the overcoat layer 250, the emission layer 262 may be further formed. The emission layer 262 is formed on the exposed overcoat layer 250 which is not covered by the bank 300. That is, the emission layer 262 may be formed within the dummy pattern DP defined by the bank 300.

Differently from the display area AA, in the non-display area NDA, at least some or all of the signal lines and circuit elements are not formed in the circuit element layer. In addition, as shown, the first electrode 261 is not formed in the dummy pattern DP. Accordingly, the emission layer 262 of the dummy pattern DP does not emit light.

The emission layer 262 may be formed by a solution process in which a solution is applied to the dummy pattern DP and the applied solution is dried. Herein, the emission layer 262 of the dummy pattern DP may be formed through a single solution process with the emission layer 262 of the corresponding pixel column. That is, inkjet equipment, and the like may apply a solution to the pixels PXs in the same color arranged in one pixel column and to the dummy pattern DP disposed adjacent to the pixel column, through a single process. Afterward, when the applied solution is dried, the emission layer 262 is formed in the shape extending in the pixel column direction from the pixels PXs to the dummy pattern DP.

As described above, regarding the emission layer 262, the difference in thickness between the central area of the emission layer 262 and the edge area adjacent to the bank 300 may occur due to the tension between the solution and the bank 300.

On the emission layer 262, the second electrode 263 and the encapsulation layer may be formed. The second electrode 263 and the encapsulation layer may be formed in the same structure and through a single process as the second electrode 263 and the encapsulation layer formed in the display area AA. That is, the second electrode 263 and the encapsulation layer may be formed in the structure extending from the display area AA to the non-display area NDA. However, in various aspects, the second electrode 263 may not be formed in the non-display area NDA.

In such a structure of the display panel 50, the dummy pattern DP is provided to solve the imbalance in light emission between the center portion and the outer portion of the pixel column in the display area AA. As described above, the emission layer 262 may be formed through a single solution process for one pixel column. When the solution is dried, dewetting may occur in which the solution is subjected to dewetting, starting from the outer portion. When the degree of the dewetting is large, the emission layer 262 is not correctly formed in predetermined pixels arranged at the outer portion (specifically, opposite ends of the pixel column) in the pixel column, which may result in pixel defects.

In order to solve this problem, the solution may be applied beyond the pixel column area to the dummy pattern DP.

Then, dewetting occurs in the dummy pattern DP, so that pixel defects in the display area AA may be prevented.

If the area of the dummy pattern DP is wide, pixel defects caused by dewetting are effectively prevented. However, if the area of the dummy pattern DP is excessively wide, the non-display area NDA of the display panel 50 is thus wide, making it difficult to implement a narrow bezel. In addition, if the area of the dummy pattern DP is set narrow, dewetting is spread to the outer portion of the display area AA depending on a drying environment, which may result in pixel defects.

In the following aspects, a structure of the bank 300 in the non-display area NDA is proposed in which the area of the dummy pattern DP is reduced by minimizing dewetting in the dummy pattern DP while pixel defects caused by dewetting are prevented.

Figure 6:
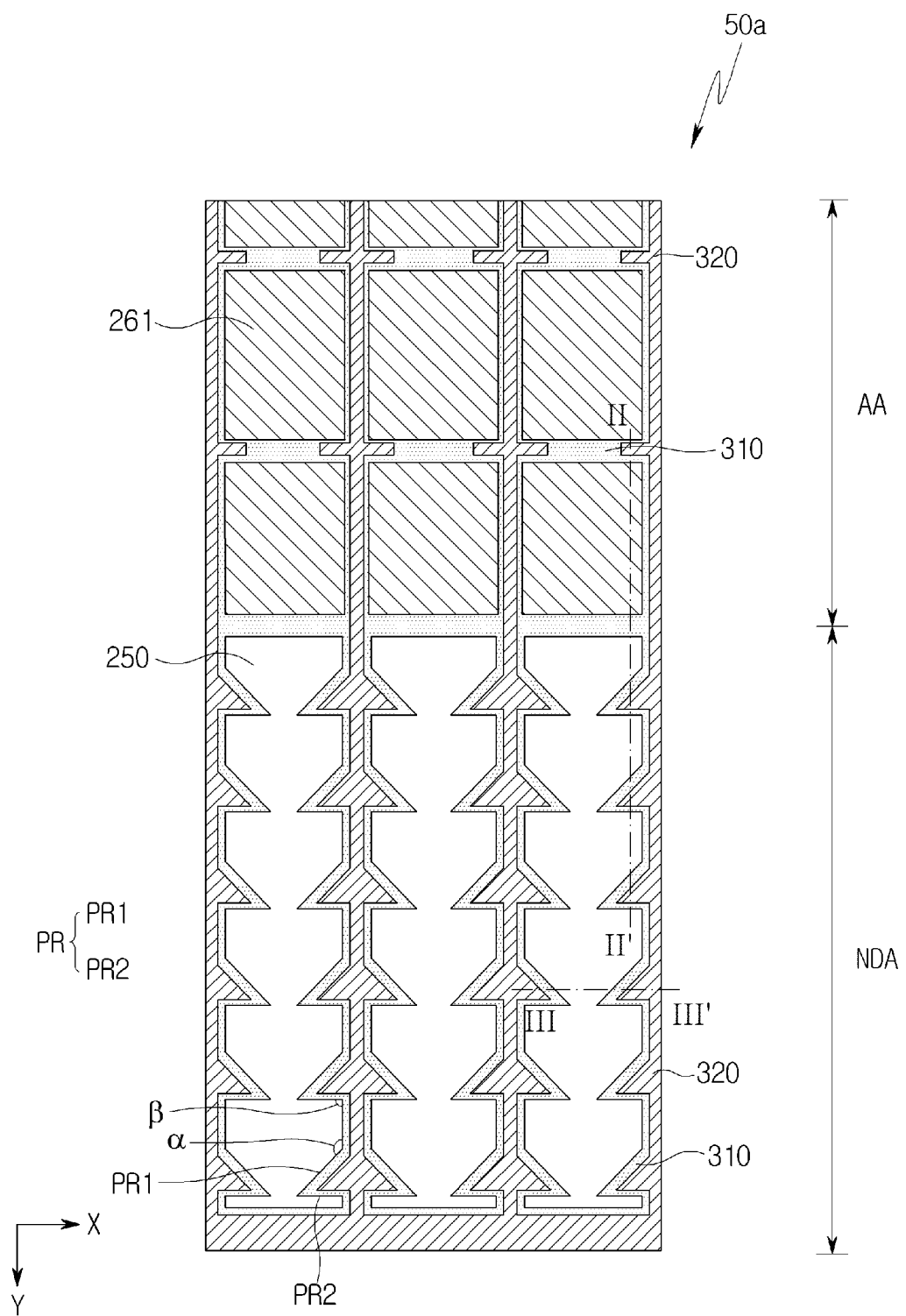
FIG. 6 is a plan view of a display panel according to a first aspect of the present disclosure.
Figure 7:
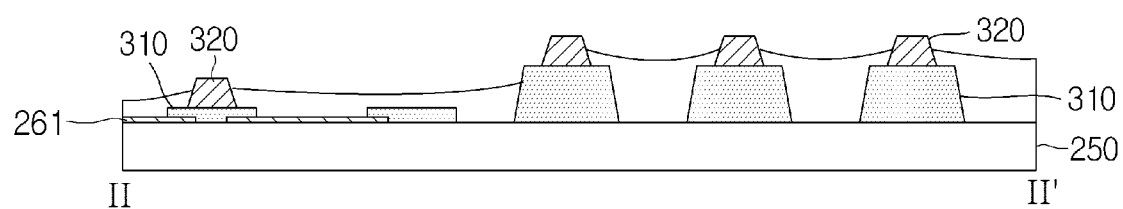
FIG. 7 is a cross-sectional view taken along line II-II' of FIG. 6.
Figure 8:
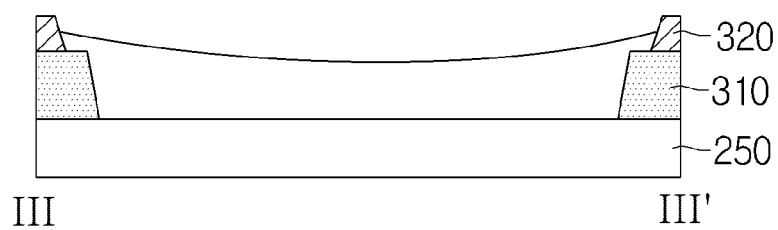
FIG. 8 is a cross-sectional view taken along line III-III' of FIG. 6.

FIG. 6 is a plan view of a display panel 50a according to a first aspect. FIG. 7 is a cross-sectional view taken along line II-II' of FIG. 6. FIG. 8 is a cross-sectional view taken along line III-III' of FIG. 6.

Referring to FIGS. 6 to 8, in the non-display area NDA, a bank 300 defines a dummy pattern DP in the shape of a bar extending in the pixel column direction. This bank 300 may include a first bank 310 and a second bank 320.

The first bank 310 may have a hydrophilic property. For example, the first bank 310 may be made of an inorganic insulation material such as a silicon oxide.

In the first aspect, the first bank 310 may be formed in such a manner as to be thicker (higher) than the second bank 320, and may be formed in such a manner as to be wider than the second bank 320. In this aspect, the first bank 310 may be thicker in the non-display area NDA than in the display area AA.

The bank 300 may be formed through a single process in the display area AA and the non-display area NDA. For example, the first bank 310 may be formed in a pattern through a photolithography process. Herein, since the first bank 310 has different thicknesses in the display area AA and the non-display area NDA, a half-tone mask is applied in the photolithography process.

In another aspect, the first bank 310 having different thicknesses in the display area AA and the non-display area NDA may be formed through separate processes in the display area AA and the non-display area NDA. For example, in the display area AA, the first bank 310 of a first thickness may be formed through a photolithography process. Afterward, in the non-display area NDA, the first bank 310 of a second thickness may be formed through a photolithography process.

The second bank 320 is formed on the first bank 310. The second bank 320 may be formed in a pattern through a photolithography process after applying a solution that is a mixture of an organic insulation material with hydrophilicity and a hydrophobic material such as fluorine. Due to the light emitted during the photolithography process, the hydrophobic material such as fluorine may move to the top of the second bank 320, and the top of the second bank 320 may thus have a hydrophobic property. However, this aspect is not limited thereto. The entire portion of the second bank 320 may be formed to have a hydrophobic property.

The second bank 320 may be formed in such a manner as to be thinner in the non-display area NDA than in the display area AA, and may be formed in such a manner as to be narrower in the non-display area NDA than in the display area AA. In an aspect, the second bank 320 may have the same thickness in the display area AA and the non-display area NDA, but is not limited thereto.

In an aspect, the second bank 320 may be formed through a single process in the display area AA and the non-display area NDA. For example, the second bank 320 may be formed in a pattern through a photolithography process.

In various aspects, the bank 300 may include at least one protrusion PR protruding from a side of the bank 300 into the dummy pattern DP. Each protrusion PR may have the shape of a polyhedron, for example, a pentahedron, a hexahedron, and the like. Herein, each protrusion PR may have a first inclined side PR1, and a second inclined side PR2 disposed farther from the display area AA than the first inclined side PR1.

The first inclined side PR1 extends from the side of the bank 300 toward the inside of the dummy pattern DP in the X-axis direction (X). Herein, the first inclined side PR1 may be placed in such a manner as to be at an obtuse angle to the side of the bank 300. That is, the first inclined side PR1 extends from the side of the bank 300 in at least the opposite direction of the display area AA. The angle α between the first inclined side PR1 and the side of the bank 300 side may exceed at least 90°.

In the case where the first inclined side PR1 disposed nearer to the display area AA than the second inclined side PR2 is placed to be at an obtuse angle to the side of the bank 300, a solution applied to the dummy pattern DP may easily move in the direction of the end portion of the dummy pattern DP (specifically, the Y-axis direction (Y)) along the first inclined side PR1. That is, the first inclined side PR1 is at an obtuse angle to the side of the bank 300, so that the solution within the dummy pattern DP is not prevented from spreading in the Y-axis direction (Y). Herein, the direction in which the solution spreads may be the direction in which the dummy pattern DP extends.

The second inclined side PR2 extends from the side of the bank 300 toward the inside of the dummy pattern DP. Herein, the second inclined side PR2 may be placed in such a manner as to be at an acute angle or at least a right angle to the side of the bank 300. That is, the second inclined side PR2 extends from the side of the bank 300 at least vertically, or in the opposite direction of the display area AA. The angle β between the second inclined side PR2 and the bank 300 may be equal to or less than 90°.

In the case where the second inclined side PR2 disposed away the display area AA is placed to be at an acute angle or a right angle to the side of the bank 300, movement of the solution, which is applied to the dummy pattern DP, in the direction of the display area AA (specifically, the X-axis direction (X)) may be restricted due to the second inclined side PR2. That is, the second inclined side PR2 is at an acute angle or a right angle to the side of the bank 300, so that the solution within the dummy pattern DP is prevented from being subjected to dewetting in the X-axis direction (X).

In the first aspect shown in FIGS. 6 to 8, the protrusion PR may have generally a shape of a triangle including the first inclined side PR1 and the second inclined side PR2. However, this aspect is not limited thereto.

Figure 9:
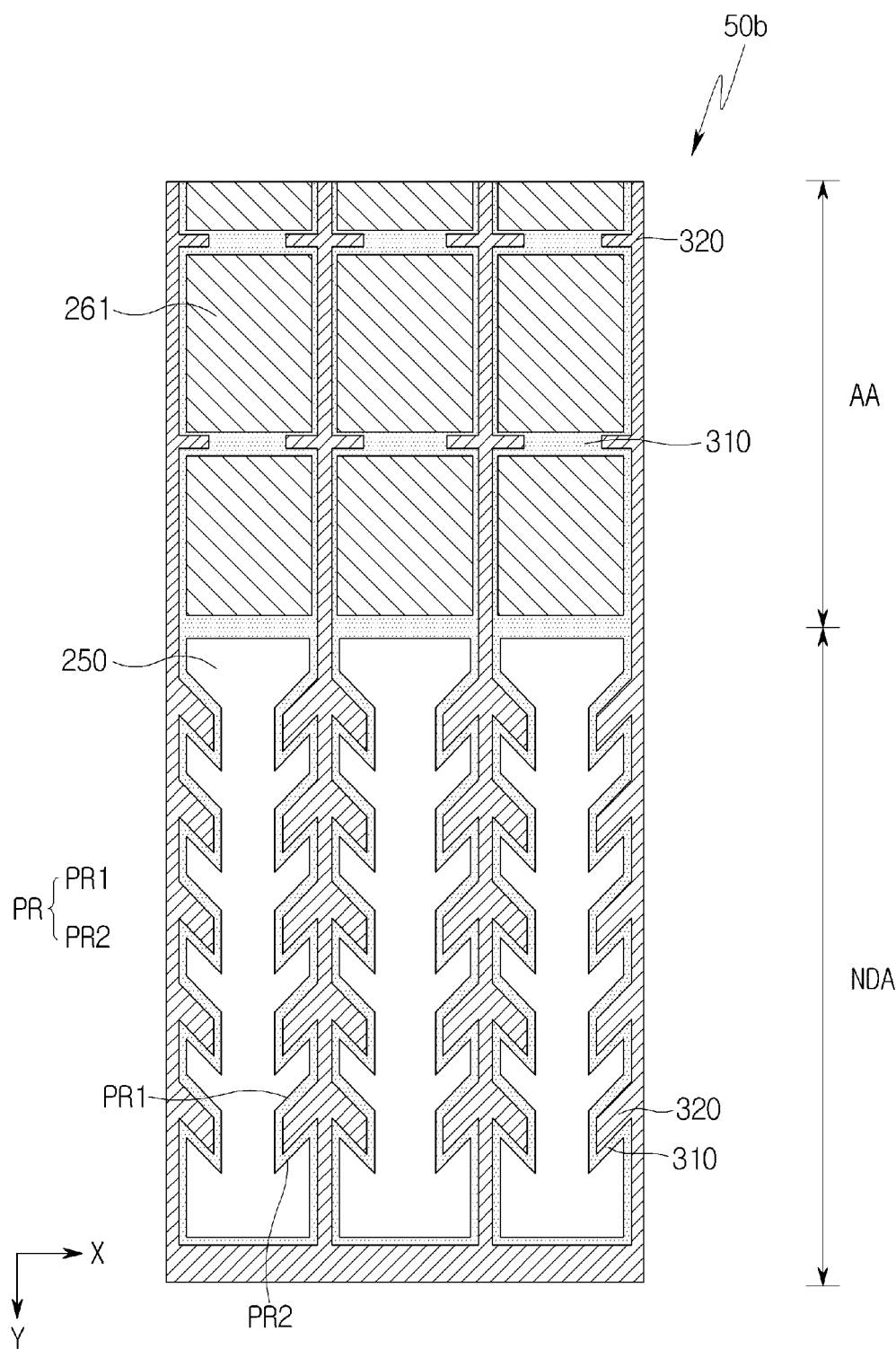
FIG. 9 is a plan view of a display panel according to a second aspect of the present disclosure.

FIG. 9 is a plan view of a display panel 50b according to a second aspect.

As shown in the second aspect of FIG. 9, a protrusion PR may have various polygonal shapes, such as a parallelogram, and the like. Even in this aspect, a first inclined side PR1 disposed nearer to the display area AA than the second inclined side PR2 is placed to be at an obtuse angle to a side of the bank 300. A second inclined side PR2 disposed away the display area AA is placed to be at an acute angle or at least a right angle to the side of the bank 300.

In the case where the bank 300 is composed of a first bank 310 with hydrophilicity and a second bank 320 with hydrophobicity, the protrusions PRs may be extended parts of the first bank 310 and the second bank 320 as shown in FIG. 9. That is, the protrusion PR may be a part of the first bank 310 and the second bank 320. In this aspect, the protrusion PR may be formed through patterning of the first bank 310 and the second bank 320.

Figure 10:
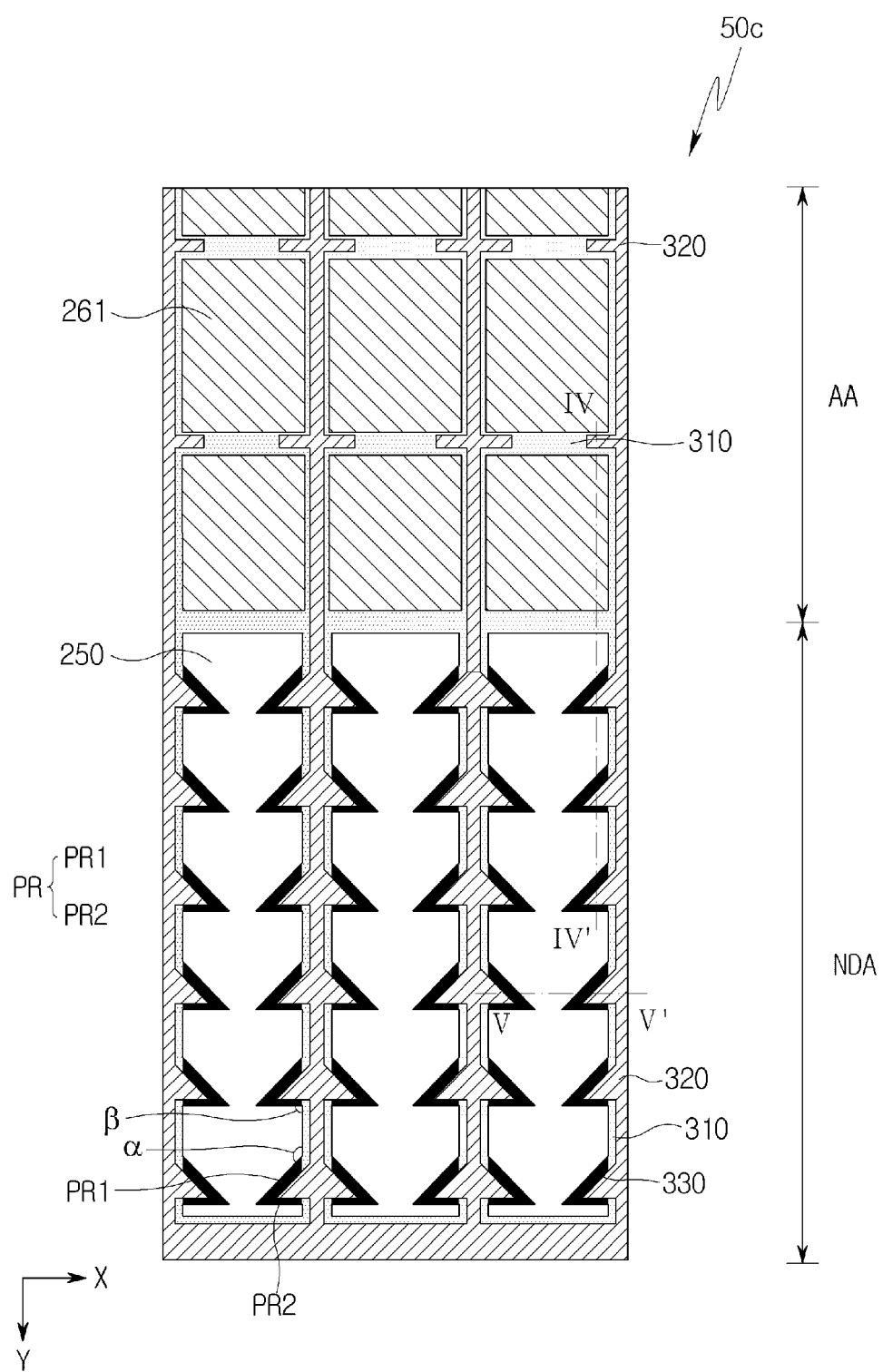
FIG. 10 is a plan view of a display panel according to a third aspect of the present disclosure.
Figure 11:
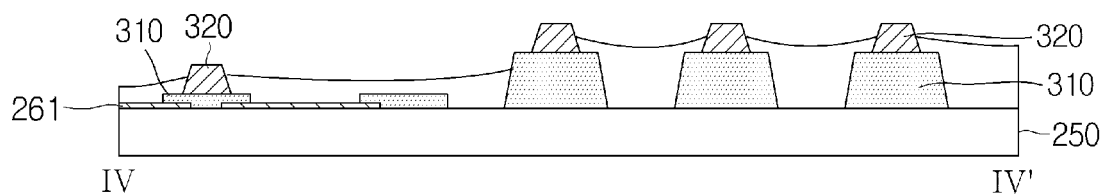
FIG. 11 is a cross-sectional view taken along line IV-IV' of FIG. 10.
Figure 12:
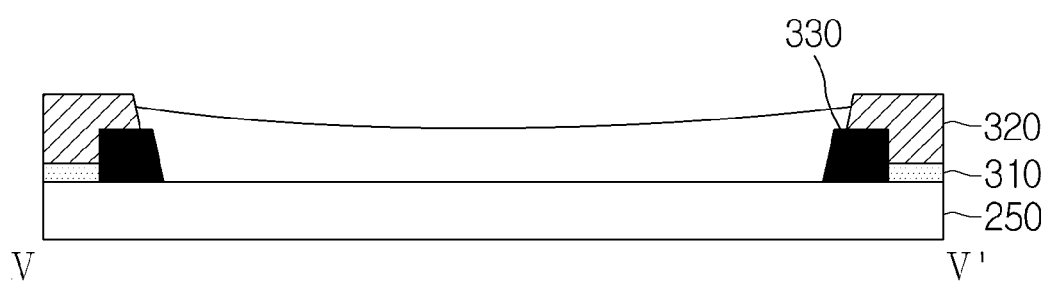
FIG. 12 is a cross-sectional view taken along line V-V' of FIG. 10.

FIG. 10 is a plan view of a display panel 50c according to a third aspect. FIG. 11 is a cross-sectional view taken along line IV-IV' of FIG. 10. FIG. 12 is a cross-sectional view taken along line V-V' of FIG. 10.

The third aspect of the present disclosure is substantially the same as the first aspect described with reference to FIGS. 6 to 8 except that the structures of the protrusions PRs are different. Therefore, the same element as in the first aspect is denoted by the same reference numeral, and a detailed description thereof will be omitted.

Referring to FIGS. 10 to 12, in the non-display area NDA, a bank 300 includes a first bank 310 and a second bank 320. In this aspect, the first bank 310 may have the same thickness in the display area AA and the non-display area NDA. In this aspect, the first bank 310 may be formed through a single process in the display area AA and the non-display area NDA.

The bank 300 may include at least one protrusion PR protruding from a side of the bank 300 into the dummy pattern DP. Each protrusion PR may have the shape of a polyhedron, and may include a first inclined side PR1, and a second inclined side PR2 disposed farther from the display area AA than the first inclined side PR1. The first inclined side PR1 may be placed to be at an obtuse angle to a side of the bank 300, and the second inclined side PR2 may be placed to be at an acute angle or at least a right angle to the side of the bank 300.

In the third aspect, the protrusion PR may include a third bank 330 with hydrophilicity as shown in FIGS. 10 and 12. The third bank 330 may be composed of the same material as the first bank 310 with hydrophilicity that accounts for another area of the bank 300. In the third aspect, the third bank 330 may be thicker than the first bank 310.

The first bank 310 and the third bank 330 having different thicknesses may be formed through a single photolithography process to which a half-tone mask is applied. Alternatively, the first bank 310 and the third bank 330 may be formed through separate processes. For example, after the first bank 310 of a first thickness is formed, the third bank 330 of a second thickness may be formed.

The second bank 320 is formed on the first bank 310 and the third bank 330. With the second bank 320 laminated, the bank 300 may have the uniform thickness in all areas. To this end, the second bank 320 on the first bank 310 is formed in such a manner as to be thicker than that on the third bank 330.

Figure 13:
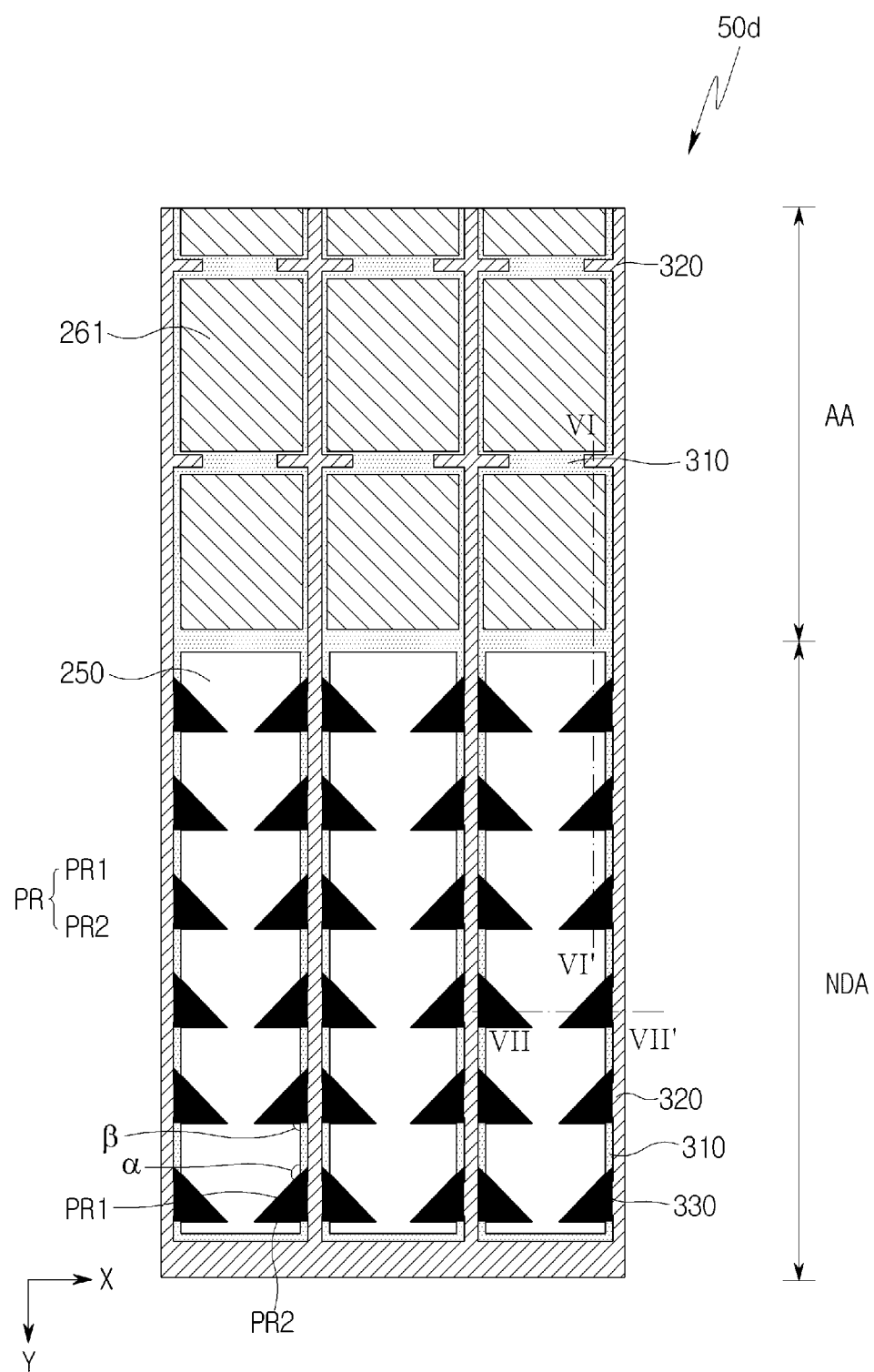
FIG. 13 is a plan view of a display panel according to a fourth aspect of the present disclosure.
Figure 14:
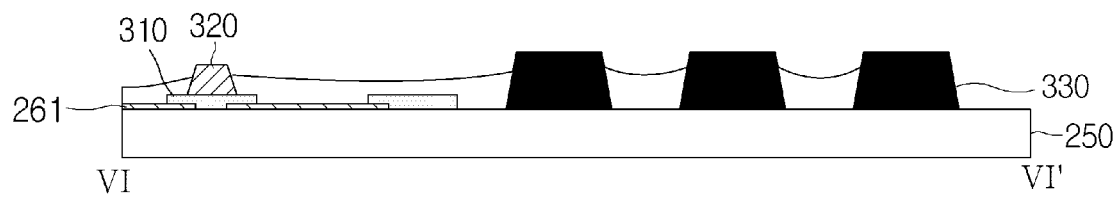
FIG. 14 is a cross-sectional view taken along line VI-VI' of FIG. 13.
Figure 15:
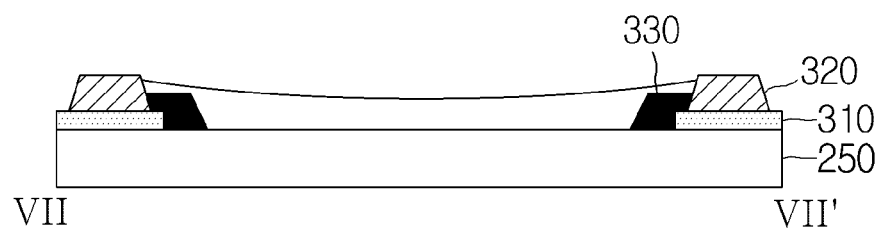
FIG. 15 is a cross-sectional view taken along line VII-VII' of FIG. 13.

FIG. 13 is a plan view of a display panel 50d according to a fourth aspect. FIG. 14 is a cross-sectional view taken along line VI-VI' of FIG. 13. FIG. 15 is a cross-sectional view taken along line VII-VII' of FIG. 13.

The fourth aspect of the present disclosure is substantially the same as the first aspect described with reference to FIGS. 6 to 8 except that the structures of the protrusions PRs are different. Therefore, the same element as in the first aspect is denoted by the same reference numeral, and a detailed description thereof will be omitted.

Referring to FIGS. 13 to 15, in the non-display area NDA, a bank 300 includes a first bank 310 and a second bank 320. In this aspect, the first bank 310 may have the same thickness in the display area AA and the non-display area NDA. In addition, the second bank 320 may have the same thickness in the display area AA and the non-display area NDA. In this aspect, the first bank 310 may be formed through a single process in the display area AA and the non-display area NDA. The second bank 320 may be formed through a single process in the display area AA and the non-display area NDA.

The bank 300 may include at least one protrusion PR protruding from a side of the bank 300 into the dummy pattern DP. Each protrusion PR may have the shape of a polyhedron, and may include a first inclined side PR1, and a second inclined side PR2 disposed farther from the display area AA than the first inclined side PR1. The first inclined side PR1 may be placed to be at an obtuse angle to a side of the bank 300, and the second inclined side PR2 may be placed to be at an acute angle or at least a right angle to the side of the bank 300.

In the fourth aspect, the protrusion PR may include a third bank 330 with hydrophilicity as shown in FIGS. 14 and 15. The third bank 330 may be composed of the same material as the first bank 310 with hydrophilicity that accounts for another area of the bank 300.

Differently from the first aspect, in the fourth aspect, the protrusion PR is composed of a single-layer bank. However, in order to effectively prevent dewetting, the height of the protrusion PR may be the same or at least similar to that of the first aspect. Therefore, the third bank 330 may be formed in such a manner as to be the same or at least similar in thickness to the other area composed of a multi-layer bank including the first bank 310 and the second bank 320.

In an aspect, the third bank 330 may be formed through a separate process from the first bank 310 and the second bank 320. For example, after the first bank 310 and the second bank 320 are formed, the third bank 330 may be formed in a pattern through a separate photolithography process. Herein, the second bank 320 is formed only on the first bank 310, and the third bank 330 covers at least a part of an exposed upper surface of the first bank 310 on which the second bank 320 is not formed, so that the third bank 330 may be in contact with the sides of the first bank 310 and the second bank 320.

Figure 16:
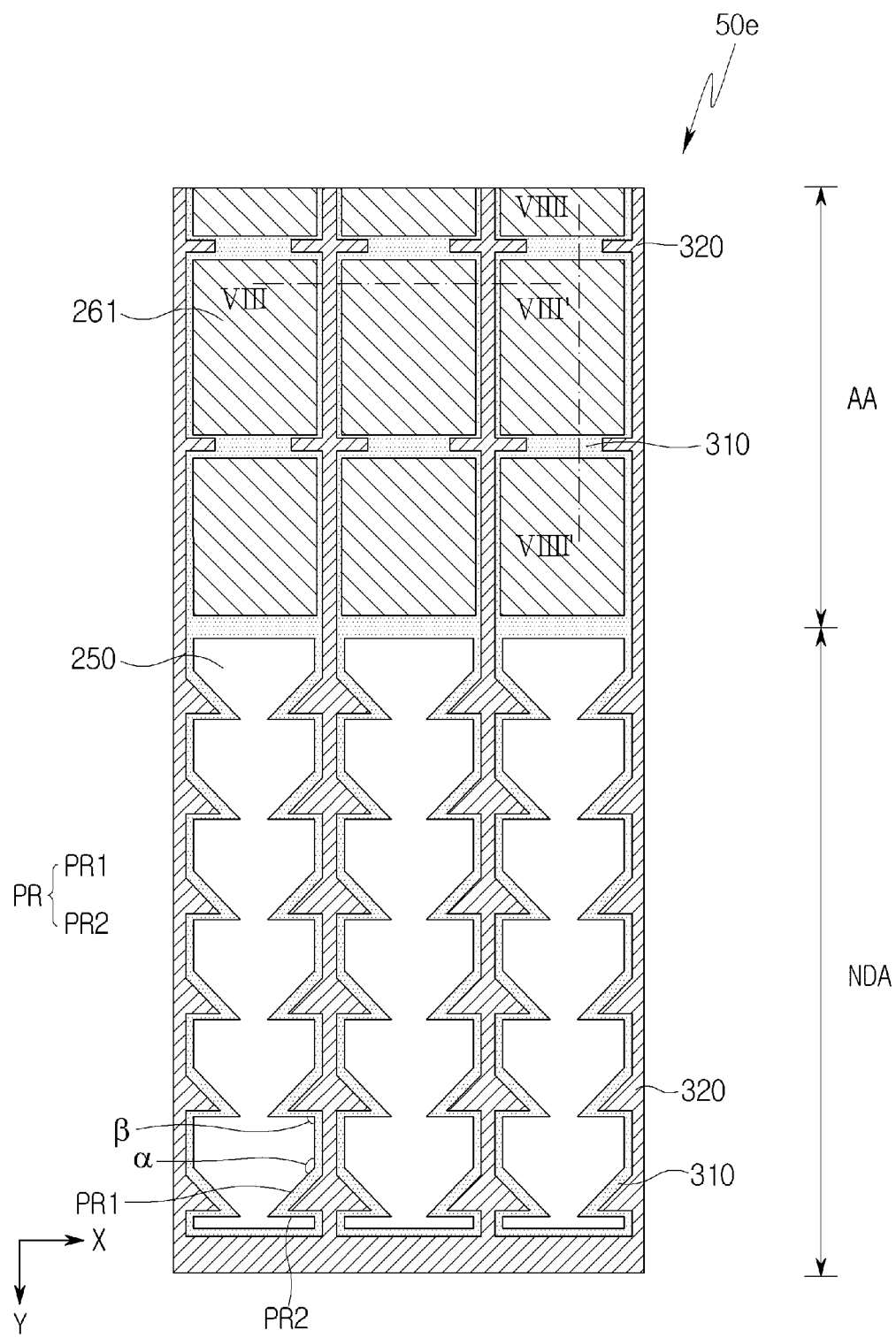
FIG. 16 is a plan view of a display panel according to an aspect of the present disclosure.
Figure 17:
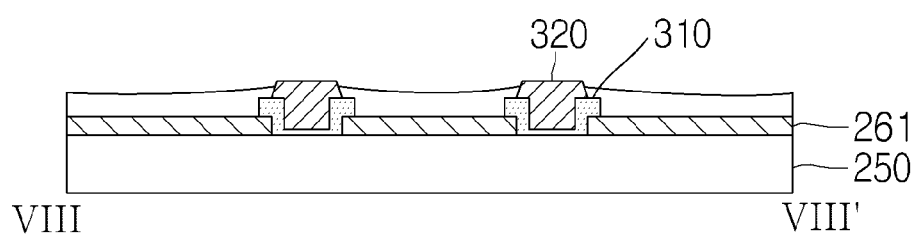
FIG. 17 is a cross-sectional view taken along line VIII-VIII' of FIG. 16.
Figure 18:
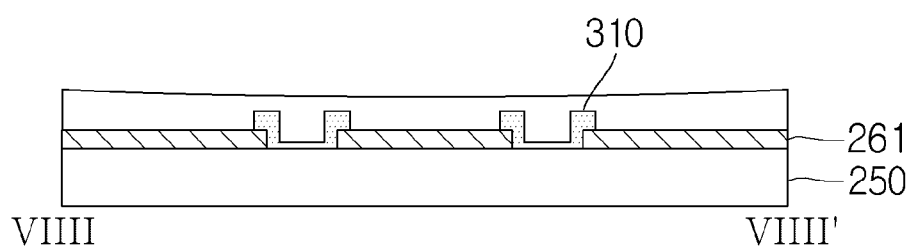
FIG. 18 is a cross-sectional view taken along line VIIII-VIIII' of FIG. 16.

FIG. 16 is a plan view of a display panel 50e according to an aspect. FIG. 17 is a cross-sectional view taken along line VIII-VIII' of FIG. 16. FIG. 18 is a cross-sectional view taken along line VIIII-VIIII' of FIG. 16.

FIGS. 16 to 18 show a more detailed configuration of the bank 300 formed in the display area AA. In various aspects, the bank 300 may be composed of a first bank 310 having a hydrophilic property, and a second bank 320 having a hydrophobic property. In an aspect, the first bank 310 may be formed in such a manner as to be thinner than the second bank 320, and may be formed in such a manner as to be wider than the second bank 320.

The second bank 320 may be formed in a pattern through a photolithography process after applying a solution that is a mixture of an organic insulation material with hydrophilicity and a hydrophobic material such as fluorine. Due to the light emitted during the photolithography process, the hydrophobic material such as fluorine may move to the top of the second bank 320, and the top of the second bank 320 may have a hydrophobic property. However, this aspect is not limited thereto. The entire portion of the second bank 320 may be formed to have a hydrophobic property.

In various aspects, the first bank 310 may be formed in the shape of a grid extending in the row direction and the column direction to define each of the pixels PXs. That is, the first bank 310 may be placed between the pixel columns and the pixel rows. In this aspect, along the first bank 310 with hydrophilicity formed in the shape of a grid, the spread of a solution in the Y-axis direction (Y) and the X-axis direction (X) in the display area AA may be enhanced.

The second bank 320 is formed on the first bank 310 and is formed extending in the column direction. That is, the second bank 320 is formed on an area of the first bank 310 extending in the column direction. The mixing of the solution between pixels PXs adjacent in the row direction may be prevented by the second bank 320 with hydrophobicity formed in the column direction.

In an aspect, the second bank 320 may include one or more extended parts EXs extending into pixel column area. The extended part EX may be formed in an area of the first bank 310 extending in the row direction. In this aspect, the second bank 320 may have the shape of a bottleneck of which the width narrows between the adjacent extended parts EX. When the emission layer 262 is formed by applying a solution to an area surrounded by the second bank 320, the emission layer 262 has the shape of a bottleneck corresponding to the shape of the second bank 320.

It will be understood by those skilled in the art that the present disclosure can be embodied in other specific forms without changing the technical idea or essential characteristics of the present disclosure. Therefore, it should be understood that the aspects described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A display device comprising:
   a substrate including a display area in which pixels are arranged and a non-display area in which a plurality of dummy patterns are arranged, the non-display area surrounding the display area;
   an emission layer disposed in the pixels and the plurality of dummy patterns; and
   a bank surrounding the emission layer,
   wherein the bank includes a plurality of protrusions protruding from a side of the bank to the plurality of dummy patterns in the non-display area,
   wherein the bank in the display area has a thickness greater than a thickness of the bank in the non-display area.

2. The display device of claim 1, wherein each of the plurality of protrusions comprises:
   a first side; and
   a second side disposed farther from the display area than the first side,
   wherein the first side extends from the side of the bank to form an obtuse angle to the side of the bank, and the second side extends from the side of the bank to form an acute angle or a right angle to the side of the bank.

3. The display device of claim 2, wherein the bank comprises:
   a first bank with hydrophilicity; and
   a second bank formed on the first bank, and provided with at least one area with hydrophobicity.

4. The display device of claim 3, wherein each of the plurality of protrusions comprises:
   a first extended part extending from the first bank; and
   a second extended part extending from the second bank.

5. The display device of claim 3, wherein each of the plurality of protrusions comprises a third bank with hydrophilicity and the third bank has a thickness greater than a thickness of the first bank.

6. The display device of claim 5, wherein each of the plurality of protrusions further comprises the second bank disposed on the third bank.

7. The display device of claim 5, wherein the third bank covers at least a part of an upper surface of the first bank on which the second bank is not disposed and contacts a side of the second bank.

8. The display device of claim 3, wherein the first bank in the non-display area has a thickness equal to or greater than a thickness of the first bank in the display area.

9. The display device of claim 3, wherein in the display area, the first bank is disposed between pixel columns of the display area and between pixel rows of the display area, and
   in the display area, the second bank is disposed on the first bank between the pixel columns.

10. The display device of claim 1, wherein each of the plurality of dummy patterns has a shape of a bar extending from an adjacent pixel row or an adjacent pixel column.

11. The display device of claim 1, wherein for each pixel column, the emission layer is formed integrally in each pixel column and each dummy pattern adjacent to each pixel column.

12. The display device of claim 1, wherein a thickness of the emission layer in a central region is smaller than a thickness of the emission layer in an edge region adjacent to the bank.

13. The display device of claim 1, further comprising:
   an anode electrode disposed under the emission layer for each of the pixels in the display area; and
   a cathode electrode disposed on the emission layer and the bank.

14. A display device comprising:
   a display area where a plurality of pixels are arranged;
   a non-display area where a plurality of dummy patterns are arranged and surrounding the display area;
   an emission layer disposed in the pixels and the plurality of dummy patterns; and
   a bank surrounding the emission layer,
   wherein the bank includes a plurality of protrusions protruding from a side of the bank to the plurality of dummy patterns in the non-display area,
   wherein the plurality of protrusions includes a first side and a second side disposed farther from the display area than the first side,
   wherein the bank in the display area has a thickness greater than a thickness of the bank in the non-display area.

15. The display device of claim 14, wherein the first side extends from the side of the bank to form an obtuse angle to the side of the bank, and the second side extends from the side of the bank to form an acute angle or a right angle to the side of the bank.

16. The display device of claim 15, wherein the bank comprises:
   a first bank with hydrophilicity; and
   a second bank formed on the first bank, and provided with at least one area with hydrophobicity.

17. The display device of claim 16, wherein each of the plurality of protrusions comprises:
   a first extended part extending from the first bank; and
   a second extended part extending from the second bank.

18. The display device of claim 17, wherein each of the plurality of protrusions comprises a third bank with hydrophilicity and the third bank has a thickness greater than a thickness of the first bank.

19. The display device of claim 18, wherein each of the plurality of protrusions further comprises the second bank disposed on the third bank.

20. The display device of claim 18, wherein the third bank covers at least a part of an upper surface of the first bank on which the second bank is not disposed and contacts a side of the second bank.

* * * * *